United States Patent
Chang et al.

(10) Patent No.: US 10,804,387 B1
(45) Date of Patent: Oct. 13, 2020

(54) VERTICAL SUPERLATTICE TRANSISTORS

(71) Applicants: Josephine Bea Chang, Ellicott City, MD (US); Robert S. Howell, Silver Spring, MD (US); Matthew R. King, Wake Forest, NC (US)

(72) Inventors: Josephine Bea Chang, Ellicott City, MD (US); Robert S. Howell, Silver Spring, MD (US); Matthew R. King, Wake Forest, NC (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/360,828

(22) Filed: Mar. 21, 2019

(51) Int. Cl.
*H01L 29/778* (2006.01)
*H01L 29/15* (2006.01)
(Continued)

(52) U.S. Cl.
CPC .... *H01L 29/7788* (2013.01); *H01L 21/02507* (2013.01); *H01L 29/0847* (2013.01);
(Continued)

(58) Field of Classification Search
CPC ........... H01L 29/7788; H01L 29/66462; H01L 29/7786; H01L 29/0847; H01L 29/155; H01L 21/02507
See application file for complete search history.

(56) References Cited

U.S. PATENT DOCUMENTS

| 5,391,895 A | 2/1995 | Dreifus |
| 7,355,257 B2 | 4/2008 | Kishimoto et al. |

(Continued)

FOREIGN PATENT DOCUMENTS

| EP | 2202801 | * 6/2010 | ........... H01L 29/778 |
| EP | 2202801 A2 | * 6/2010 | ....... H01L 29/66462 |

(Continued)

OTHER PUBLICATIONS

Machine translation, Nakayama, WIPO Pat. Pub. No. WO 2010/016212, translation date: Apr. 20, 2020, all pages. (Year: 2020).*
(Continued)

*Primary Examiner* — Victoria K. Hall
(74) *Attorney, Agent, or Firm* — Tarolli, Sundheim, Covell & Tummino LLP

(57) ABSTRACT

A vertical transistor is provided that includes a base structure and a superlattice structure overlying the base structure. The superlattice structure comprises a multichannel ridge having sidewalls. The multichannel ridge comprises a plurality of heterostructures that each form a channel of the multichannel ridge. The vertical transistor also includes a source region that overlies the base structure and is in contact with a first end of the superlattice structure, a floating drain that overlies the base structure and is in contact with a second end of the superlattice structure, and a drain. When the vertical transistor is in an 'ON' state, current flows from the source region through the channels of the multichannel ridge to the floating drain, which funnels the current to the drain through at least a portion of the base structure.

20 Claims, 19 Drawing Sheets

(51) Int. Cl.
*H01L 29/08* (2006.01)
*H01L 29/66* (2006.01)
*H01L 21/02* (2006.01)

(52) U.S. Cl.
CPC ...... *H01L 29/155* (2013.01); *H01L 29/66462* (2013.01); *H01L 29/7786* (2013.01)

(56) References Cited

U.S. PATENT DOCUMENTS

| | | |
|---|---|---|
| 7,781,827 B2 | 8/2010 | Rao |
| 8,183,572 B2 * | 5/2012 | Kikkawa ............. H01L 29/0649 257/76 |
| 8,461,626 B2 * | 6/2013 | Renaud ............... H01L 29/7788 257/194 |
| 8,519,438 B2 * | 8/2013 | Mishra ................ H01L 29/2003 257/192 |
| 9,147,615 B2 * | 9/2015 | Afzali-Ardakani .......................... H01L 29/0847 |
| 9,166,006 B1 * | 10/2015 | Rezanezhad Gatabi ...................... H01L 29/205 |
| 9,183,572 B2 | 11/2015 | Brubaker |
| 9,202,906 B2 * | 12/2015 | Howell ................ H01L 29/155 |
| 9,318,572 B2 * | 4/2016 | Afzali-Ardakani .... G06N 3/063 |
| 9,385,224 B2 | 7/2016 | Renaldo et al. |
| 9,419,120 B2 | 8/2016 | Nechay et al. |
| 9,466,679 B2 | 10/2016 | Stewart et al. |
| 9,472,634 B2 | 10/2016 | Stewart et al. |
| 9,711,615 B2 | 7/2017 | Nechay et al. |
| 9,735,383 B2 * | 8/2017 | Afzali-Ardakani .......................... H01L 29/0649 |
| 9,755,021 B2 | 9/2017 | Renaldo et al. |
| 9,773,897 B2 | 9/2017 | Nechay et al. |
| 9,780,181 B1 | 10/2017 | Teo et al. |
| 9,972,797 B2 * | 5/2018 | Afzali-Ardakani .......................... H01L 29/0843 |
| 10,084,075 B2 | 9/2018 | Nechay et al. |
| 10,476,016 B2 * | 11/2019 | Afzali-Ardakani .......................... H01L 29/66462 |
| 2008/0203430 A1 | 8/2008 | Simin et al. |
| 2009/0315037 A1 * | 12/2009 | Kikkawa ............. H01L 29/0649 257/76 |
| 2011/0024799 A1 * | 2/2011 | Minoura ............... H01S 5/0217 257/201 |
| 2012/0139008 A1 * | 6/2012 | Imada ................ H01L 29/7832 257/194 |
| 2014/0264273 A1 * | 9/2014 | Howell ............... H01L 29/1037 257/20 |
| 2015/0034904 A1 * | 2/2015 | Fujimoto .......... H01L 21/02389 257/20 |
| 2015/0235123 A1 * | 8/2015 | Afzali-Ardakani .......................... H01L 51/0566 706/33 |
| 2015/0270356 A1 * | 9/2015 | Palacios ................ H01L 21/283 257/76 |
| 2016/0126340 A1 * | 5/2016 | Nechay ............. H01L 29/66462 257/20 |
| 2016/0284828 A1 * | 9/2016 | Shimizu ............ H01L 29/66462 |
| 2017/0125574 A1 * | 5/2017 | Chowdhury ........ H01L 29/2003 |
| 2018/0350917 A1 * | 12/2018 | Ujita ..................... H01L 27/098 |
| 2019/0115448 A1 * | 4/2019 | Chowdhury ........ H01L 21/0262 |
| 2019/0115459 A1 * | 4/2019 | Kim .................... H01L 33/0004 |
| 2020/0058782 A1 * | 2/2020 | Then ................... H01L 29/7783 |

FOREIGN PATENT DOCUMENTS

| | | | | |
|---|---|---|---|---|
| WO | WO 2010/016212 | * | 2/2010 | ........... H01L 21/338 |
| WO | WO 2010/016213 | * | 2/2010 | ............. H01L 29/80 |
| WO | WO 2017/138398 | * | 8/2017 | ........... H01L 21/337 |
| WO | WO-2017138398 A1 | * | 8/2017 | ......... H01L 29/7787 |

OTHER PUBLICATIONS

Non Final Office Action for U.S. Appl. No. 16/252,952 dated Feb. 5, 2020.

* cited by examiner

VERTICAL SUPERLATTICE TRANSISTORS

TECHNICAL FIELD

The present disclosure relates generally to transistors, and more particularly to vertical superlattice transistors.

BACKGROUND

Certain heterostructure materials, such as aluminum gallium nitride (AlGaN) and GaN, create an electron well (i.e., a sheet of electrons) at the interface between the two dissimilar materials resulting from the piezoelectric effect and spontaneous polarization effect between those two dissimilar materials. The piezoelectric effect and spontaneous polarization cause a sheet of electrons at the interface between the two dissimilar materials called a two-dimensional electron gas ("2DEG") channel. Equally applicable is a lattice structure having a plurality of two-dimensional hole gas (2DHG) channels. Both of these types of structures are known as "2DxG channel(s)" devices. FETs that operate by generating and controlling the charge carriers in the 2DxG channel are generally called high electron mobility transistors ("HEMTs").

By stacking a plurality of these two-material heterostructures, and with the addition of appropriate doping in the layers to maintain the presence of the 2DxG channels when stacking a plurality of heterostructure layers, the charge sheets are able to act in parallel, allowing for greater current flow through the superlattice device. When this type of FET is "on", the superlattice device has a lower on-resistance, relative to a single heterostructure-layer device, because the multiple 2DxG channels allow a proportionally higher current to flow between the source and drain, resulting in an overall reduction in on-resistance. This type of structure has been well suited for providing an ultra-low channel resistance high-frequency switch.

A Super-Lattice Castellated gate Field Effect Transistor, or SLCFET, is a transistor built out of a superlattice of 2DxG channels (e.g. multiple pairs of barrier and channel epitaxial layers such as AlGaN/GaN grown and stacked on top each other to produce 2DEG or 2DHG channels).

Power transistors that operate at higher voltages and with better heat dissipation are desirable. In general, GaN devices on SiC are of particular interest for power transistors due to the combination of wide bandgap in GaN and high thermal conductivity in SiC. Therefore, SLCFET devices built out of AlGaN/GaN on SiC can operate at a higher voltage without electrical fields breaking down the device and causing failure of the device, making them suitable for use as power transistors.

SUMMARY

In one example, a vertical transistor is provided that comprises a base structure and a superlattice structure overlying the base structure. The superlattice structure comprises a multichannel ridge having sidewalls. The multichannel ridge comprises a plurality of heterostructures that each form a channel of the multichannel ridge. The vertical transistor also includes a source region that overlies the base structure and is in contact with a first end of the superlattice structure, a floating drain that overlies the base structure and is in contact with a second end of the superlattice structure, and a drain. When the vertical transistor is in an 'ON' state, current flows from the source region through the channels of the multichannel ridge to the floating drain, which funnels the current to the drain through at least a portion of the base structure.

In another example, a transistor comprises a base structure, a generally circular source region that overlies the base structure, and a floating drain that overlies the base structure and resides within the generally circular source region. The transistor further comprises a superlattice structure overlying the base structure positioned in between the generally circular source region and the floating drain, and comprising a plurality of multichannel ridges spaced apart from one another by non-channel openings and each having sidewalls. Each of the plurality of multichannel ridges are formed from a plurality of heterostructures that each form a channel of the plurality of multichannel ridges. The plurality of multichannel ridges and non-channel openings each having a generally radial direction from the floating drain region to the generally circular source region. The transistor comprises a drain, wherein when the vertical transistor is in an 'ON' state, current flows from the generally circular source region through the channels of the multichannel ridges to the floating drain, which funnels the current to the drain through at least a portion of the base structure.

In yet a further example, a method of forming a vertical transistor is disclosed. The method comprises forming a superlattice structure having a plurality of heterostructures over a base structure, and etching openings in the superlattice structure to form a plurality of multichannel ridges spaced apart from one another by non-channel openings. Each of the plurality of multichannel ridges are formed from a plurality of heterostructures with each having sidewalls. The method further comprises etching a source region opening and a floating drain opening in the superlattice structure, filling the source region opening and the floating drain opening with a doped material to form a floating drain and a source region, and forming a drain in the base structure.

DETAILED DESCRIPTION

One or more examples of vertical superlattice castellated field-effect-transistors (vSLCFETs) are disclosed having a high breakdown voltage and providing for high power operation. Gallium Nitride (GaN) devices on Silicon Carbide (SiC) are useful when fabricating superlattice castellated field-effect-transistor (SLCFET) devices for use in power transistors because their combination provides for a wide bandgap in GaN and a high thermal conductivity in SiC. Vertical device structures are suitable for high voltage RF switches because the geometries and material locations provide for a large voltage between source contacts and drain contacts. Thus, some of the various examples discussed below disclose how a SLCFET can be adapted to work in a vertical configuration, enabling a GaN-on-SiC power transistor with high current density and low-loss advantages inherent to the SLCFET structure.

The vSLCFET utilizes an epitaxial approach of stacked superlattice channels on top of a substrate to yield an improved high-voltage transistor with low resistance. However, stacked 2DEG channels funnel conduction in a horizontal manner that is incompatible with vertical structures, such as vertical double-implemented metallic-oxide field-effect-transistors (FETs) (DMOSFETs) and current aperture vertical electron transistors (CAVETs). In order to funnel current from the upper levels of the stacked superlattice downwards into the substrate, at least some examples disclosed use a floating drain or floating drain plunger inserted within a generally circular source region having a generally circular source electrode, as discussed in detail below.

A castellated gate contact controls current flow from the source electrodes to the floating drain. The castellated gate contact is disposed between the source region and the floating drain plunger. The castellated gate contact substantially surrounds on top and on its sides over at least a portion of its depth a plurality of superlattice heterostructure ridges (multichannel ridges) that form a set of channels. The floating drain has a relatively low resistance and can direct the current through the substrate toward the bottom of the device. A drain or drain plug can be disposed on a bottom side of the device to capture the current. The vSLCFET device is in a normal "ON" state when no voltage is applied to the gate contact, and can be turned to an "OFF" state by applying a threshold voltage to the castellated gate contact.

Figure 1:
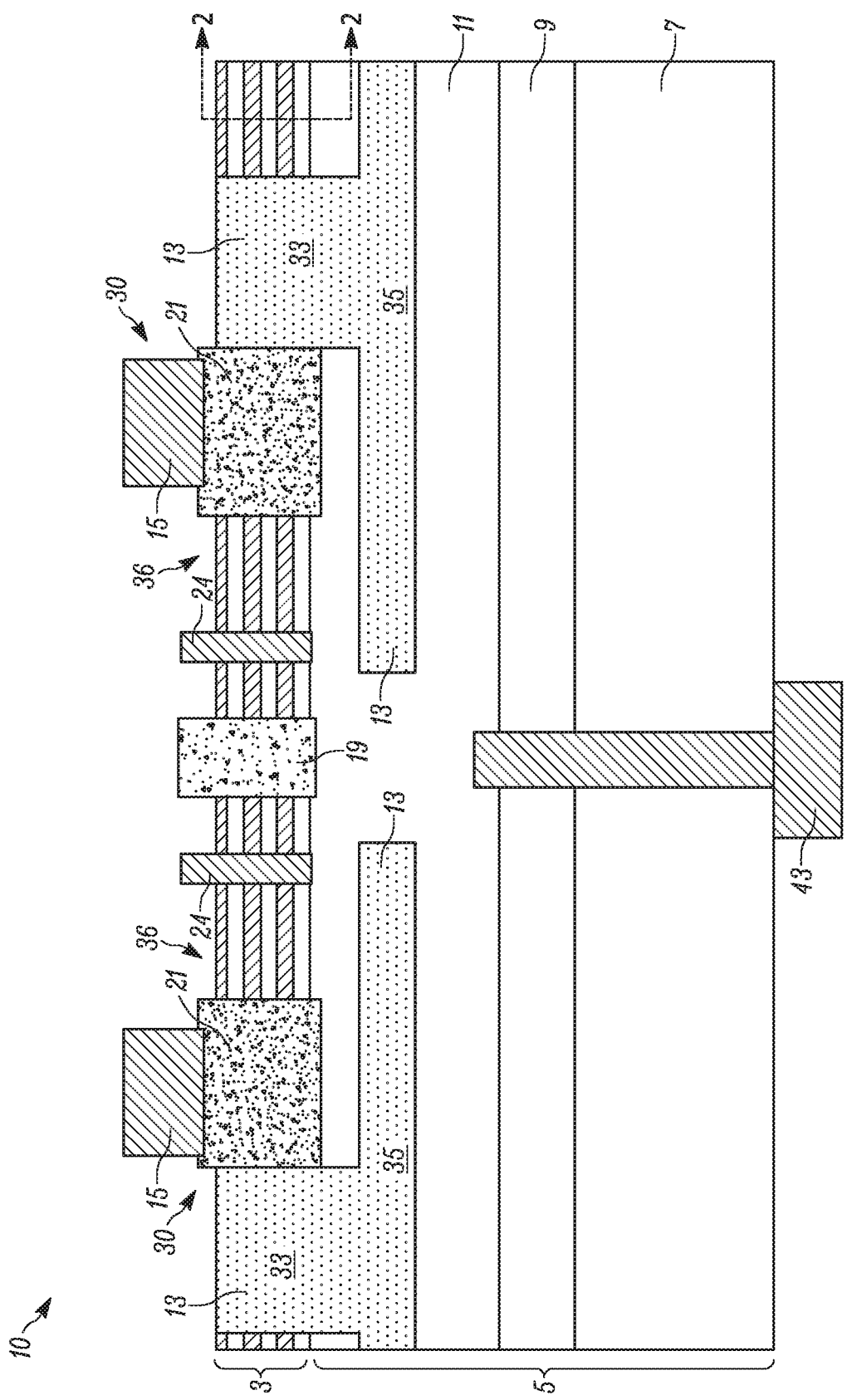
FIG. 1 illustrates an example cross-sectional view of an example vertical super-lattice castellated gate field-effect-transistor (vSLCFET) having a high breakdown voltage and providing for high power operation device.

In another example, a monolithic microwave integrated circuit (MMIC) or MMIC-compatible version of the example illustrated in example FIG. 1 is disclosed, where contacts including a drain contact are all accessed through a topside of the device. This would be compatible with operating voltages in the 100V range, potentially useful for power conditioning applications integrated on-chip with MMICs for efficient power distribution.

Figure 2:
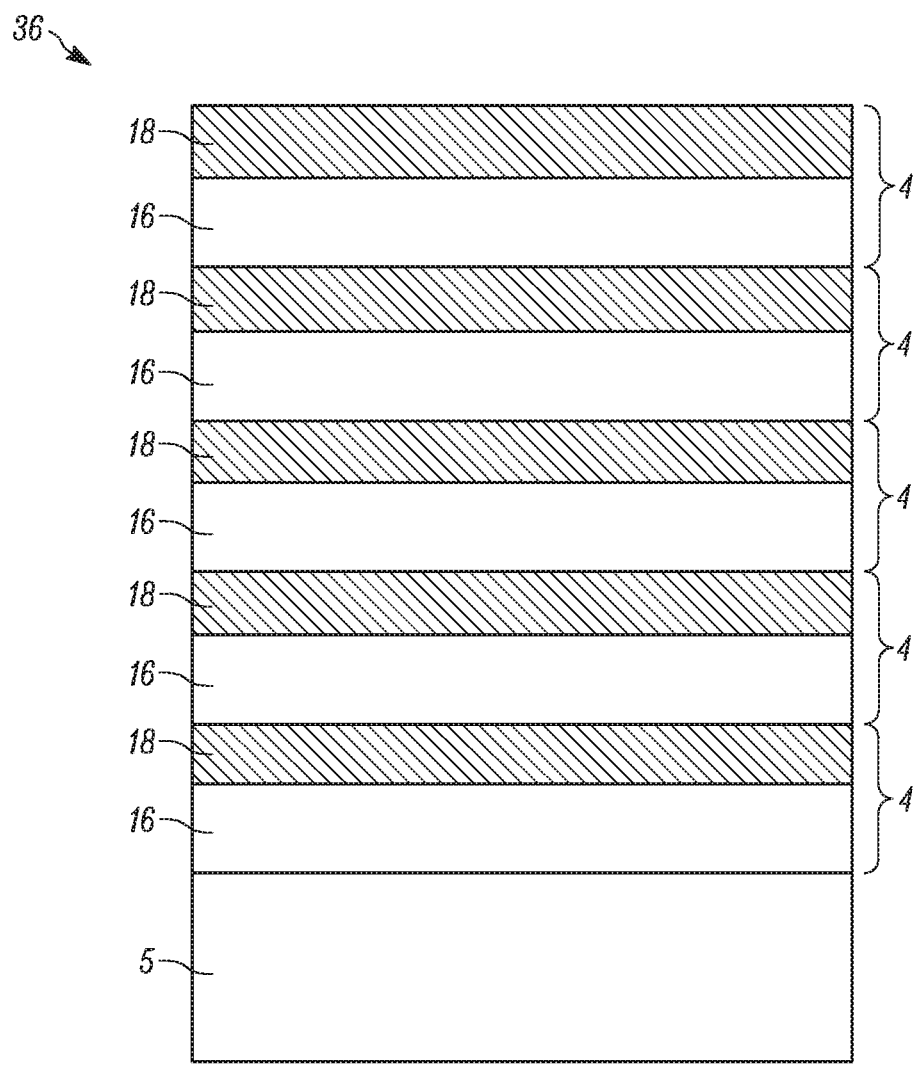
FIG. 2 illustrates a partial cross-sectional view of an example of a portion of a superlattice of the vSLCFET device of FIG. 1 along the lines 2-2.
Figure 3:
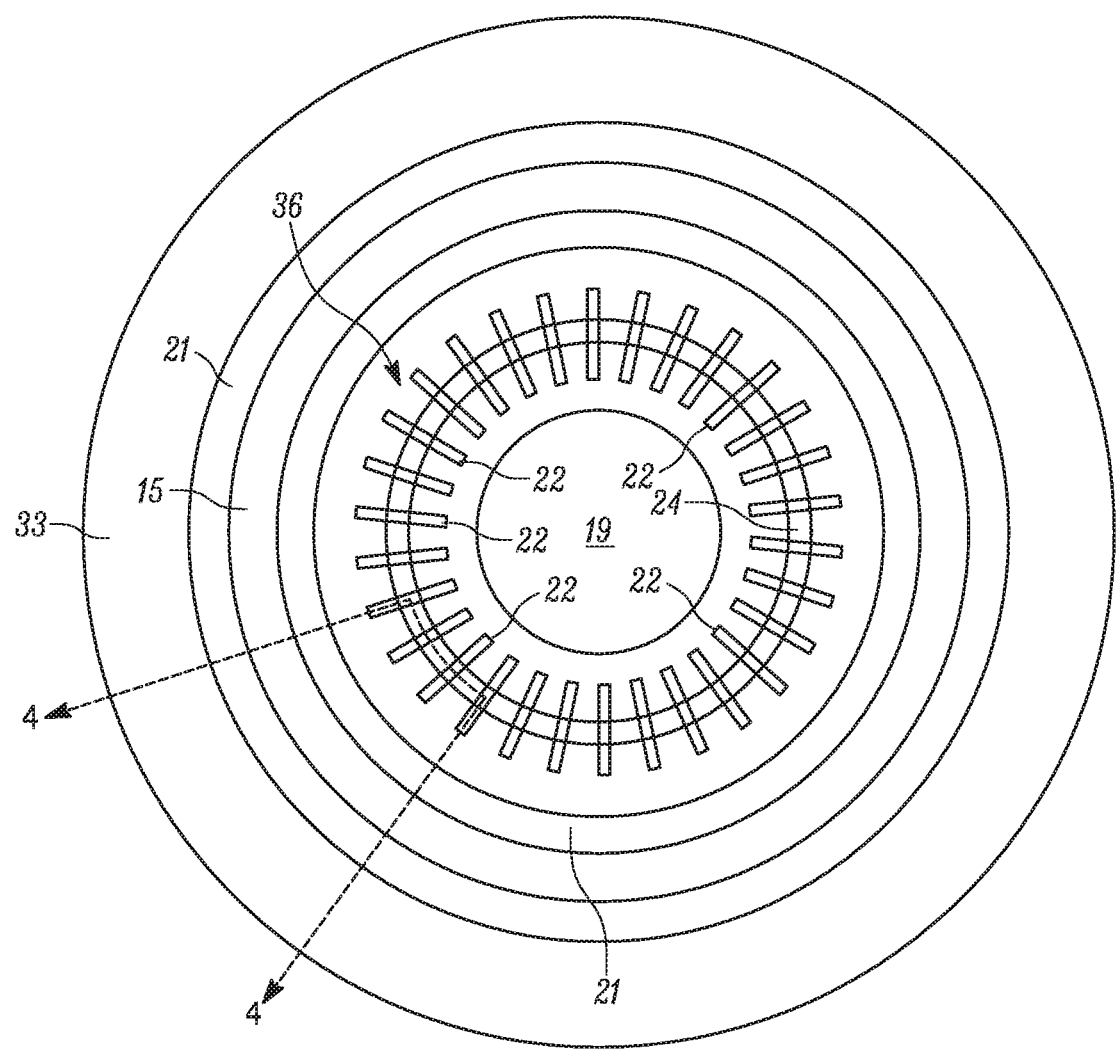
FIG. 3 illustrates a top plan view of the example vSLCFET device of FIG. 1.
Figure 4:
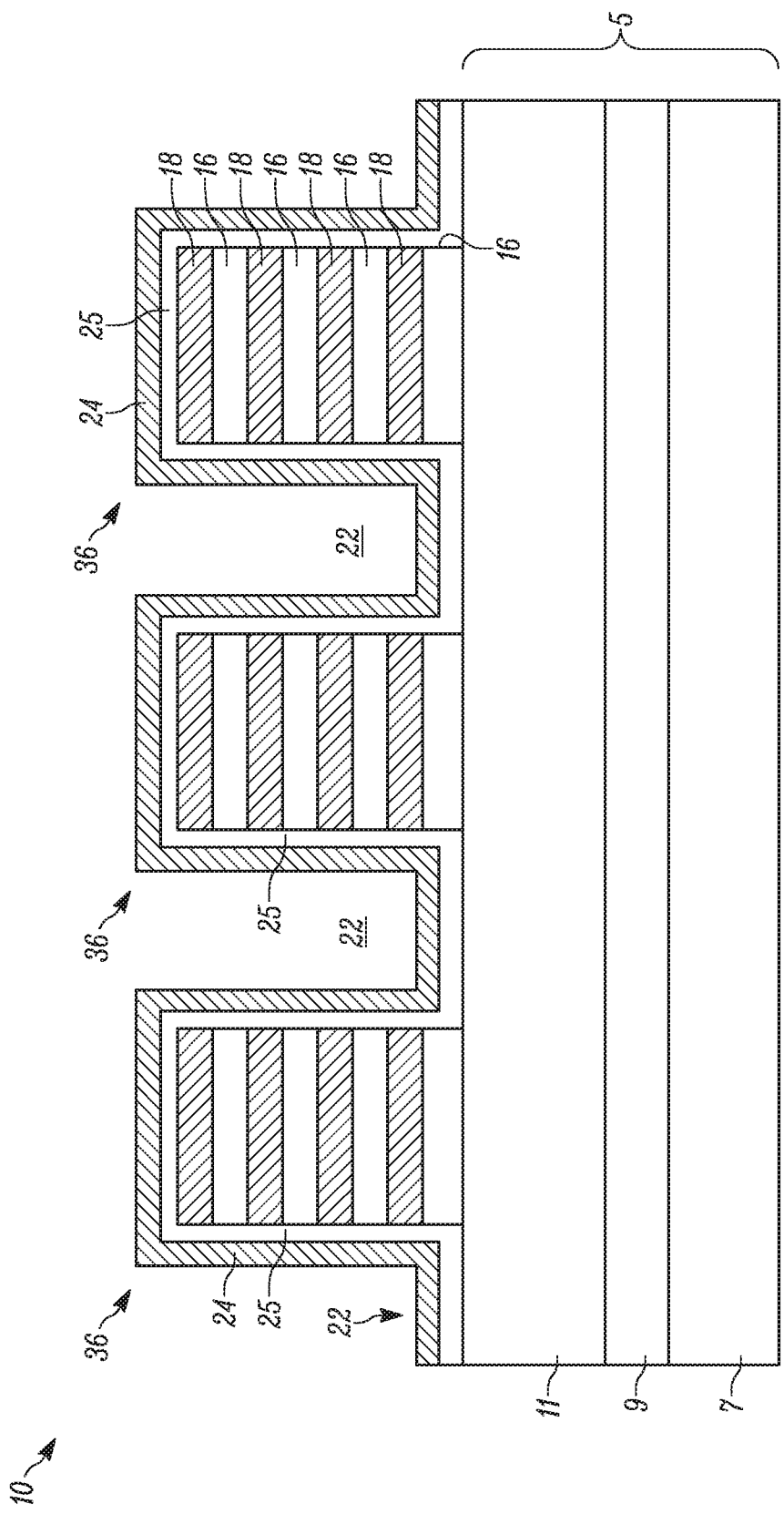
FIG. 4 illustrates a partial cross-sectional view of an example of a portion of a castellated gate of the vSLCFET device of FIG. 1 along the lines 4-4 of FIG. 3.

FIG. 1 illustrates a cross-sectional view of an example of a vSLCFET device 10 (device) having a castellated gate structure and a floating drain. FIG. 2 illustrates a partial cross-sectional view of an example of a portion of a multichannel ridge of the vSLCFET device 10 of FIG. 1 along the lines 2-2. FIG. 3 illustrates a top plan view of the vSLCFET device 10, and FIG. 4 illustrates a partial cross-sectional view of an example of a portion of a castellated gate surrounding a portion of a superlattice heterostructure of alternating multichannel ridges and non-channel openings of the vSLCFET device 10 of FIG. 1 along the lines 4-4 of FIG. 3. Although the present example is illustrated as a generally circular device as shown in the top plan view of FIG. 3, the vSLCFET device 10 can have a variety of different configurations, such as a multiple finger device, a generally rectangular device or a variety of other configurations.

The vSLCFET device 10 includes a castellated gate contact 24 disposed between a source region 30 and a floating drain 19 (n+ region). The castellated gate contact 24 substantially surrounds three sides of a plurality of multichannel ridges 36. The plurality of multichannel ridges 36 are each formed from plurality of heterostructures that includes stacks 3 of an AlGaN layer overlying a GaN layer. The plurality of multichannel ridges 36 are separated from one another by non-channel openings 22 (FIG. 4). The plurality of multichannel ridges 36 extend between the source region 30 to the floating drain 19. The castellated gate contact 24 extends through the non-channel openings such that the castellated gate contact 24 electrically couples each of the plurality of multichannel ridges 36 to one another. The vSLCFET device is in a normal "ON" state when no voltage is applied to the castellated gate contact, and can be turned to an "OFF" state by applying a threshold voltage to the castellated gate contact.

The source region 30 includes a source interface region 21 (n+ doped region) that interfaces with the plurality of multichannel ridges 36, and a source ohmic contact 15. A high voltage protection region 13 is disposed adjacent and in contact with the source interface region 21. The high voltage protection region 13 includes a surface contact portion 33 (p+ doped region) coupled to a buried portion 35 (p+ doped region).

As illustrated in FIG. 2 and FIG. 4, each multichannel ridge 36 includes a plurality of heterostructures 4 that overly a base 5 (base structure). Three layers may be used to construct the base 5 including a substrate layer 7, a lattice material layer 9, and a buffer layer 11. A drain contact 43 extends from a bottom surface of the base 5, the lattice material layer 9, and a portion of the drift region toward the floating drain 19. A protection layer 25 that is a dielectric layer (FIG. 4), for example, of silicon nitride (SiN) can overly the vSLCFET device 10, and be disposed between the plurality of multichannel ridges 36 and the castellated gate contact 24.

The substrate layer 7 can be formed of Silicon Carbide (SiC), the lattice matching material layer 9 can be formed of Aluminum Galium Nitride layer (AlGaN), and the buffer layer 11 can be formed of an undoped GaN drift region. In one example implementation, an AlGaN layer 18 overlying a GaN layer 16 form one layer of the heterostructure 4. Each heterostructure 4 forms a portion of a channel of the multichannel gate formed from the plurality of multichannel ridges 36 of the vSLCFET device 10.

The multichannel ridges 36 can comprise a plurality of heterostructures that may number between 2 and K, where K is defined as the maximum number of heterostructures that can be grown, deposited or otherwise formed on each other without cracking or other mechanical failure in the layers or 2DEG channels. One of ordinary skill in the art appreciates that several values including the value of K, relative positions of AlGaN and GaN may be reversed, other suitable materials may be used, and other parameters, options, and the like that are desirable may be used to implement the multichannel ridges 36. By stacking a plurality of these two-material heterostructures, and with the addition of appropriate doping in the layers to maintain the presence of the 2DxG channels when stacking a plurality of heterostructure layers, the electron sheets are able to act in parallel, allowing for greater current flow through each heterostructure 4.

Carriers, which form a 2DEG in a standard channel of AlGaN/GaN, can be spontaneously generated and maintained due to piezoelectric and spontaneous polarization. In this case, the AlGaN barrier is strained by virtue of its epitaxial relationship with the GaN channel and since these materials are piezoelectric, free carriers are generated in the channel. Carriers may also be generated through the insertion of doping layers within the epitaxial stack. The strain state of barrier and channel layers used, in some examples, may control the carrier concentration in the AlGaN/GaN heterostructures. One of ordinary skill in the art understands that precise control of composition, thickness, and the ordering of the AlGaN and GaN layers provides for the precise control of the production of the vSLCFET device 10. An epitaxial scheme and device fabrication method may exploit this phenomenon, which is unique to the GaN-based material system, and allows for fabrication of high-voltage high-power low-loss RF switches.

Having described the components of a vSLCFET and their orientation, the benefits, use, and operation of a high voltage power vSLCFET is now described in more detail. As previously mentioned, a vertical superlattice castellated field-effect-transistor (vSLCFET) device has a high breakdown voltage and may operate at high power. The vSLCFET is a hybrid device that is adapted from a standard (horizontal) SLCFET device to work in a vertical orientation. The vertical orientation enables a GaN-on-SiC power transistor with the high layout current density while retaining the low-loss advantages inherent to a standard SLCFET device.

Additionally, using the vSLCFET in place of traditional 2DEG provides the benefit of confining the current in the channel preventing leakage from the channel into the bulk and increasing the physical offset of source contacts from the drain contact without much penalty in series resistance. Designing a high voltage power transistor with a vertical orientation provides for a floating drain plunger to allow current to funnel from the upper levels of the stacked superlattice heterostructures downwards into the substrate. Furthermore, the floating drain 19 provides flexibility in the placement of the region across in which high voltage is spread out and dropped as current enters the floating drain 19.

As one example, the floating drain 19 may be sunk completely through the buffer layer 11 and lattice matching material layer 9 into the substrate layer 7. In such a situation, the device can combine the high mobility of a 2DEG or stacked 2DEG GaN channel with the voltage blocking capabilities of bulk SiC. In practice, the surface contact portion 33 of the high voltage protection region 13 may be grounded together and provide p-n junctions with the source interface region 21. During the off state, a large bias applied to the source region 30 cause a depletion field to grow together between the p+ region to pinch off the device 10. The depletion region prevents the electric field from growing at the gate contact 24, thus, protecting the gates from the high electric fields.

Figure 5:
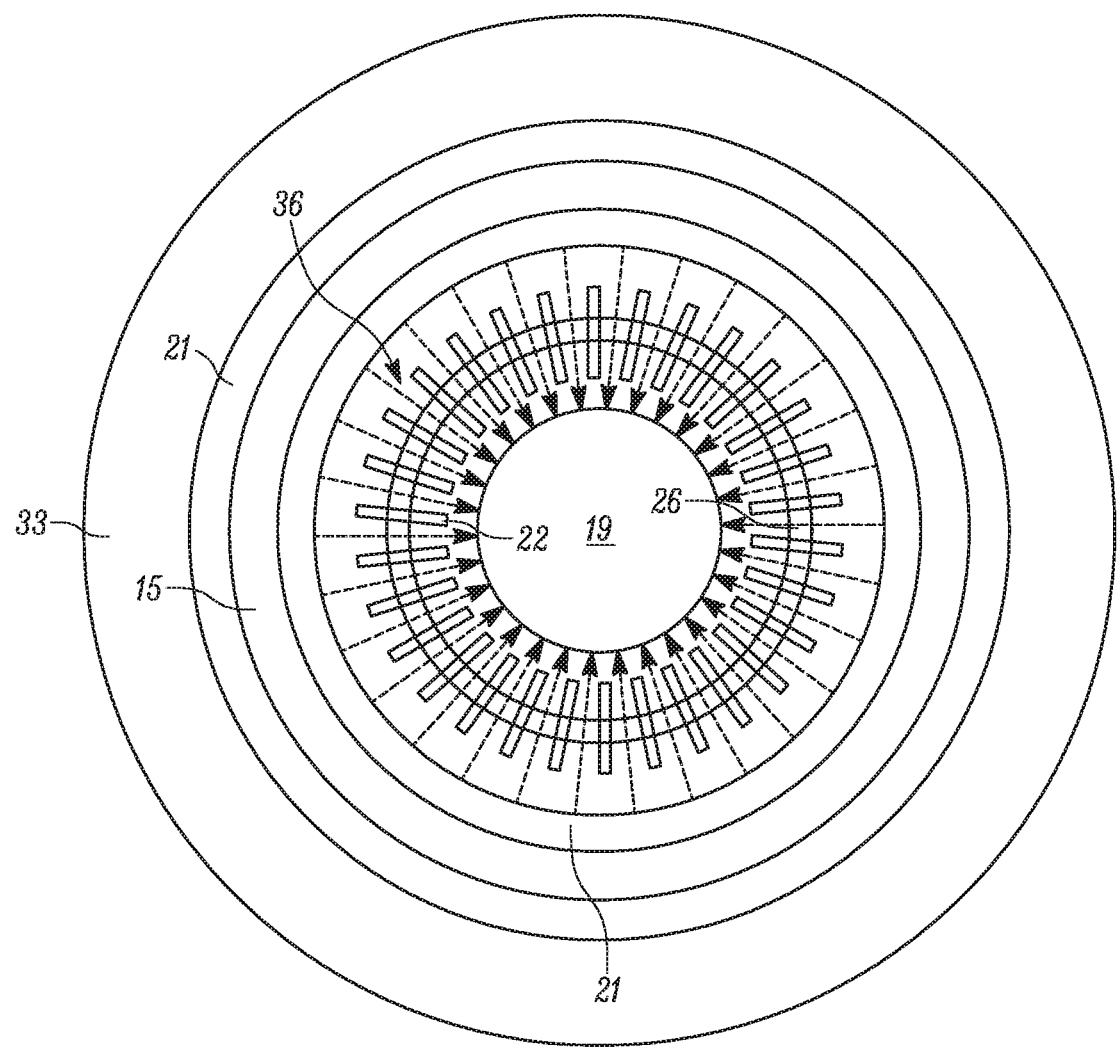
FIG. 5 illustrates an example plan view of the example vSLCFET of FIGS. 1-4 in operation with current flowing from source region through a castellated gate to a floating drain and ultimately a drain contact.
Figure 6:
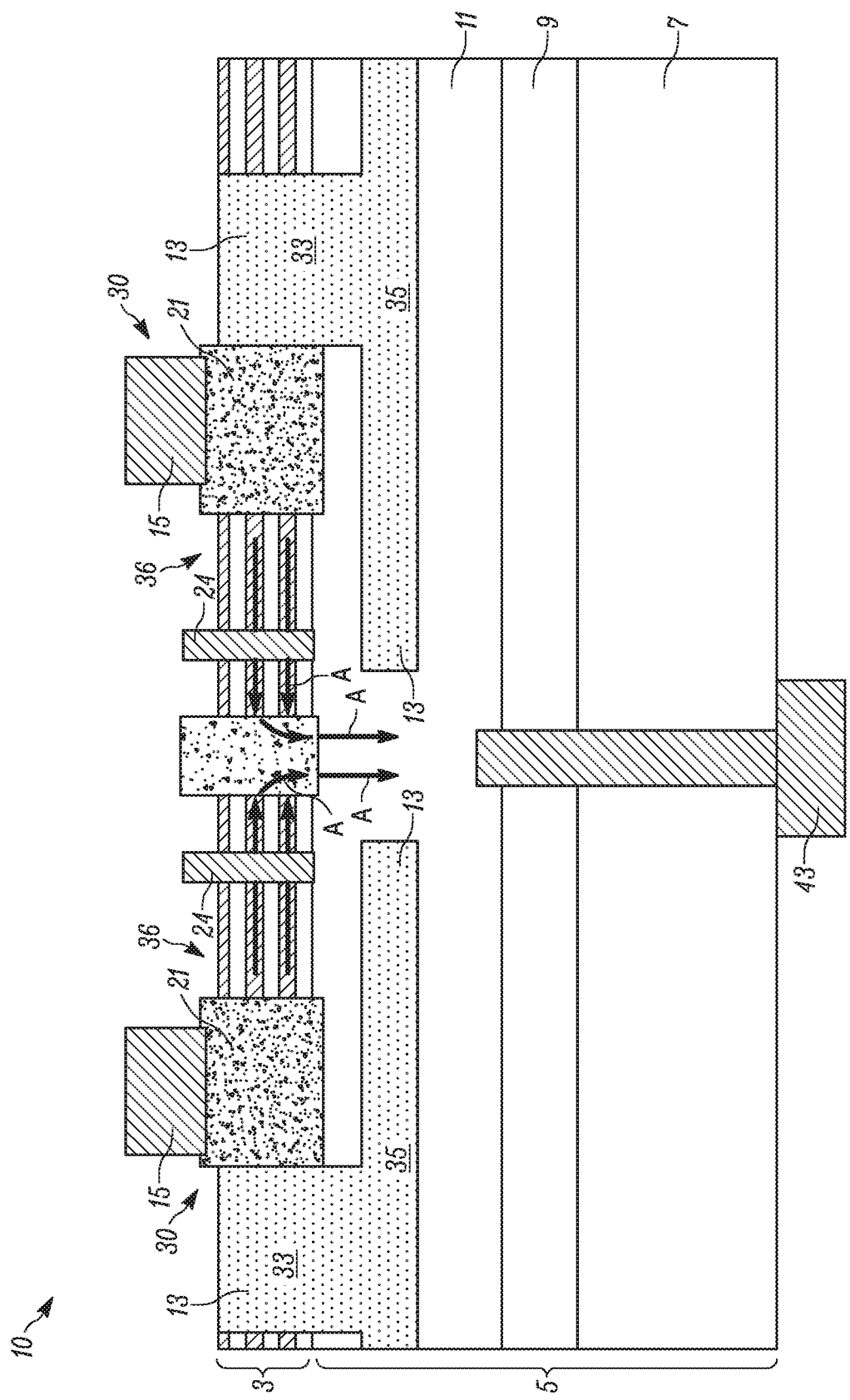
FIG. 6 illustrates an example cross-sectional side view of the example vSLCFET of FIGS. 1-4 in operation with current flowing horizontally from source region through a castellated gate to a floating drain and then flowing vertically downward toward a drain contact.

When the device goes into the "on" state in response to an applied voltage drop across the source contact 15 and the gate contact 24, for example, the vSLCFET device 10 goes into a forward bias mode. In this mode, current flows (as shown by inward-pointing broken-line arrows in FIG. 5) from the source region 30 through the plurality of multi-channel ridges 36 to the floating drain 19 (floating drain plunger). The floating drain 19 provides a pathway for the current to flow from the upper levels of the multichannel ridges 36 downwards towards the substrate as indicated by arrows A in FIG. 6. The current will then flow downwards from the floating drain 19 and through the buffer layer 11 to the drain contact 43. The downward flow of the current protects the gate from high voltage fields so that voltage breakdown is prevented.

In various example manufacturing methods and techniques of producing various vSLCFETs and other high voltage FETs the various example methods disclosed herein can provide for optimization of one or more device parameters such as, for example, the breakdown voltage, a pinch-off voltage, linearity and other device parameters. For example, the vSLCFET device 10 can be a side-pinching gate control contact multi-channel device, such as a superlattice castellated gate heterojunction field (e.g., switches) for a variety of applications such as time delay units, low loss phase shifters and attenuators, switch matrices, T/R switches, circulator replacements or as amplifiers, and the like. Though such multi-channel devices offer low on-state resistance, power consumption and related voltages can be very high and sometimes high enough to cause these devices to fail when operating at high voltages and high power.

During fabrication, carriers, which form a 2DEG in a standard channel of AlGaN/GaN, are spontaneously generated and maintained due to piezoelectric and spontaneous polarization, or introduced through dopants. In this case, the AlGaN barrier is strained by virtue of its epitaxial relationship with the GaN channel and since these materials are piezoelectric, free carriers are generated in the channel. The strain state of barrier and channel layers used, in some examples, may control the carrier concentration in the AlGaN/GaN heterostructures. One of ordinary skill in the art understands that precise control of composition, thickness, and the ordering of the AlGaN and GaN layers provides for the precise control of the production of the vSLCFET device 10. An epitaxial scheme and device fabrication method may exploit this phenomenon, which is unique to the GaN-based material system, and allows for fabrication of high-voltage high-power low-loss RF switches.

Figure 7:
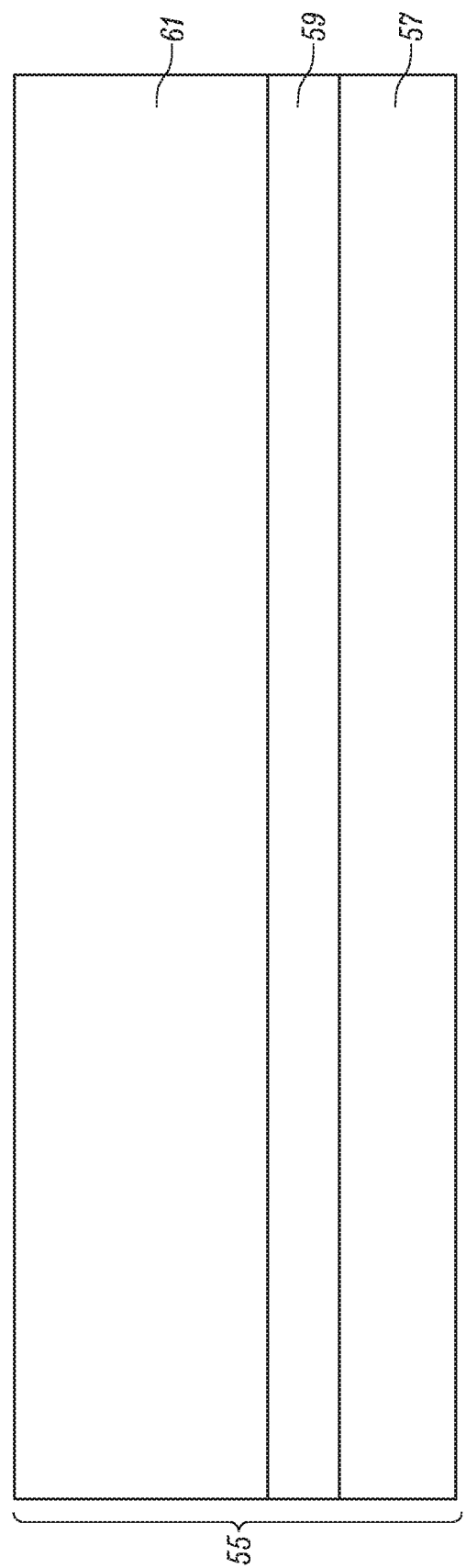
FIG. 7 illustrates an example cross-sectional view of a base of a vSLCFET early in the manufacturing process.

FIGS. 7-17 illustrate stages of an example method of fabrication in connection with formation of the example vSLCFET device illustrated in FIGS. 1-6. FIG. 7 illustrates a cross-sectional view of a vSLCFET device in its early stages of fabrication starting with a base structure 55. As discussed earlier, three layers may be used to construct the base structure 55 including a substrate layer 57, a lattice matching material layer 59, and a buffer layer 61. The substrate layer 57 can be formed of Silicon Carbide (SiC), the lattice matching material layer 59 can be formed of Aluminum Galium Nitride layer (AlGaN), and the buffer layer 61 can be formed of an undoped Galium Nitride (GaN) drift region.

Figure 8:
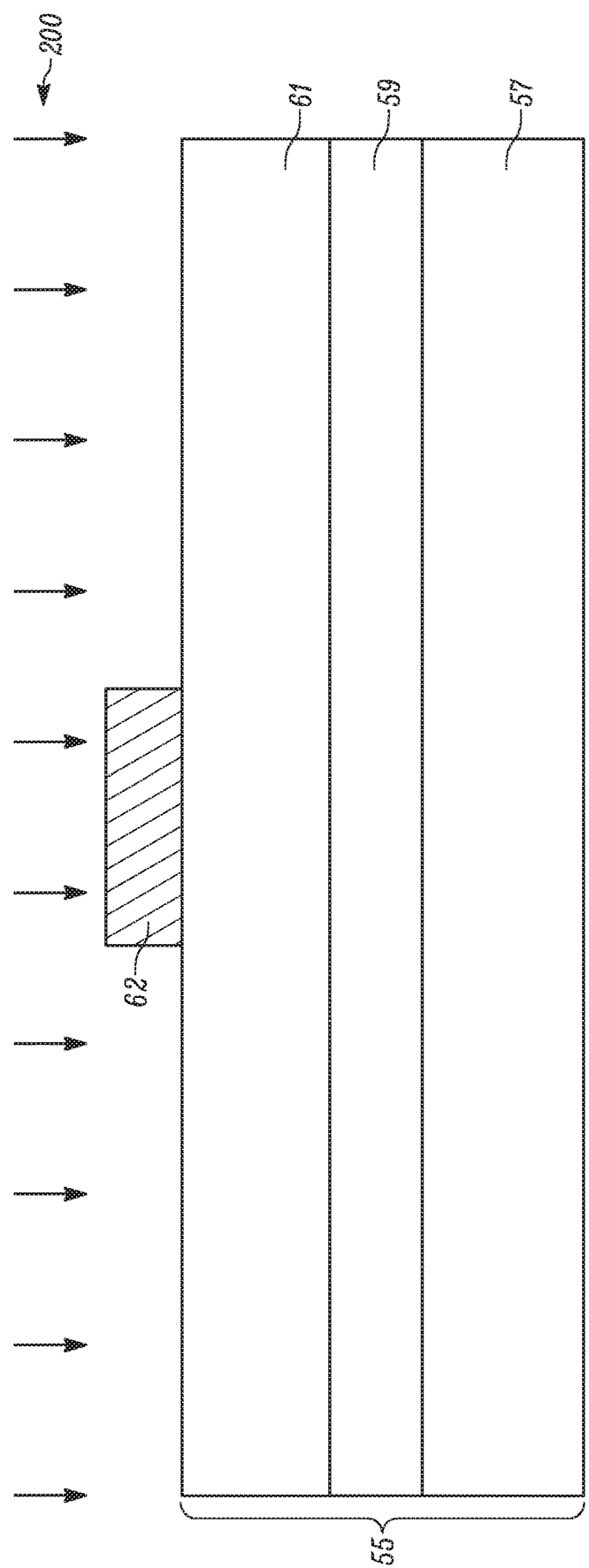
FIG. 8 illustrates an example cross-sectional view of the vSLCFET of FIG. 7 after formation of a mask defining the buried blocking layer.
Figure 9:
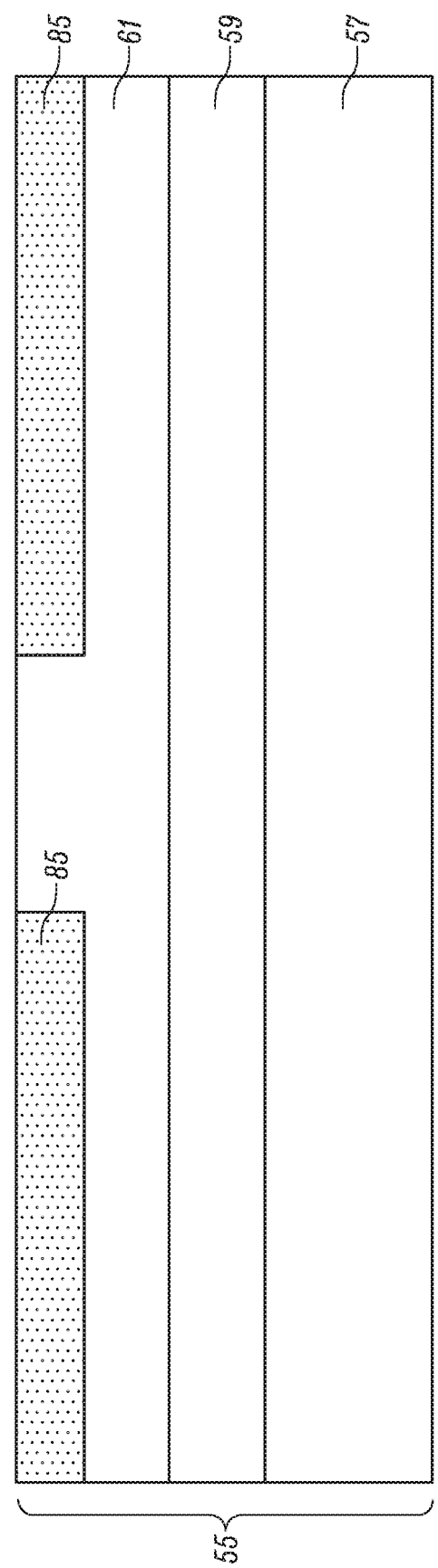
FIG. 9 illustrates an example cross-sectional view of the vSLCFET device of FIG. 8 after formation of the buried blocking layer.

FIG. 8 illustrates the stage where a protective etch mask 62 has been formed overlying the buffer layer 61. The etch mask 62 can be formed by depositing, patterning and developing a photoresist material layer over the buffer layer 61. FIG. 8 also illustrated the structure undergoing a dopant process 200 to form p-doped buried region 85 as shown in FIG. 9. Alternatively, an opening can be formed in the buffer layer 61 and doped material deposited in the opening to form p-doped buried region 85. FIG. 9 illustrates the resultant structure after the protective mask 62 has been removed.

Once the protective mask 62 has been removed, an intermediate dielectric layer 91 can be formed on the buffer layer 61, and the upper surface of the intermediate dielectric layer 91 or buffer layer 61 prepared for subsequent processing. A superlattice heterostructure 53 is then fabricated across the entire upper surface of the intermediate dielectric layer 91 resulting in the structure of FIG. 10. In one example implementation, each heterostructure is formed from an AlGaN layer overlying a GaN layer. Example methods of fabrication involve sequential growth of multichannel profiles in a monolithic epitaxial scheme known by those of ordinary skill in the art. By sequentially growing the epitaxial multichannel layers that will later become devices and appropriate doping, all devices fabricated from this structure will benefit from the inherently high-quality material properties, atomically flat interfaces and compositional control associated with epitaxial growth.

Figure 10:
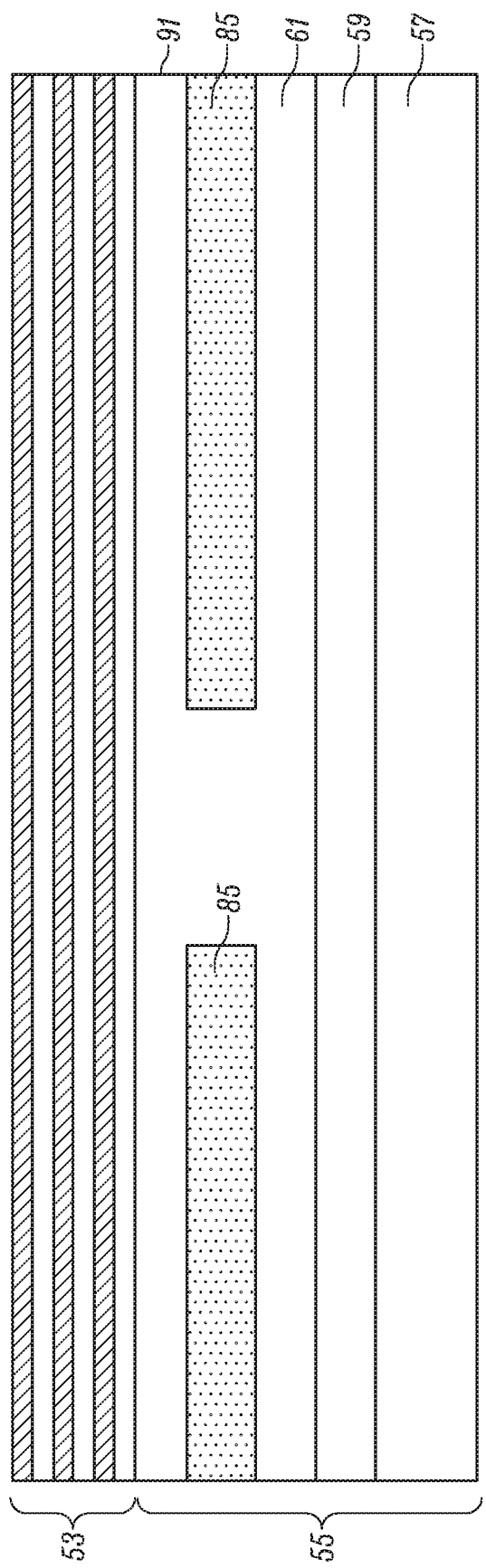
FIG. 10 illustrates a cross-sectional view of the structure of FIG. 9 after undergoing a series of deposition processes to form a superlattice.

The epitaxial growth of different materials upon each other may optionally be enhanced with appropriate deposition technique(s) until the layered lattice structures illustrated in FIG. 10 has been produced. Any suitable technique for depositing each layer can be employed such as metal organic chemical vapor deposition (MOVCD), molecular beam epitaxy (MBE), Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high-density plasma chemical vapor deposition (HDPCVD) techniques, or other suitable deposition techniques.

Figure 11:
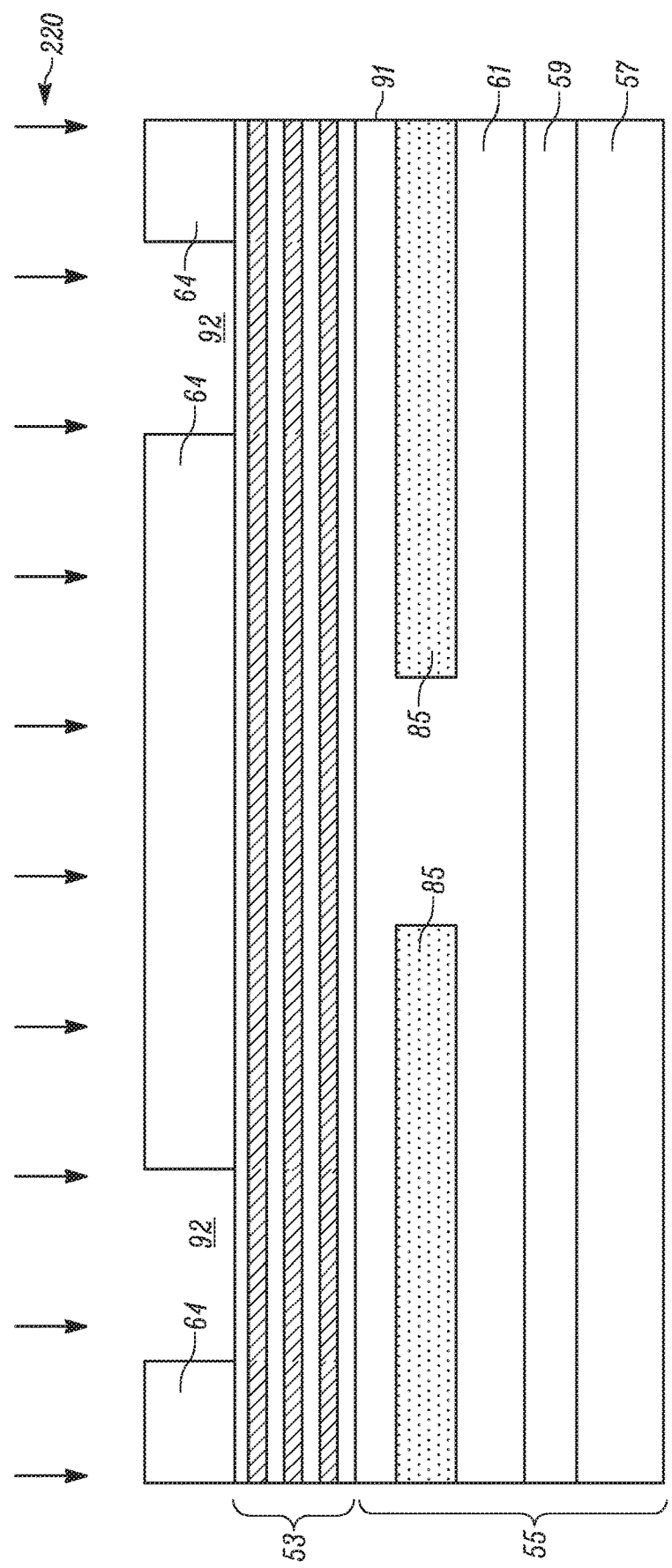
FIG. 11 illustrates a cross-sectional view of the example vSLCFET device of FIG. 10 after formation of a mask overlying the superlattice to form high voltage protection contact openings.
Figure 12:
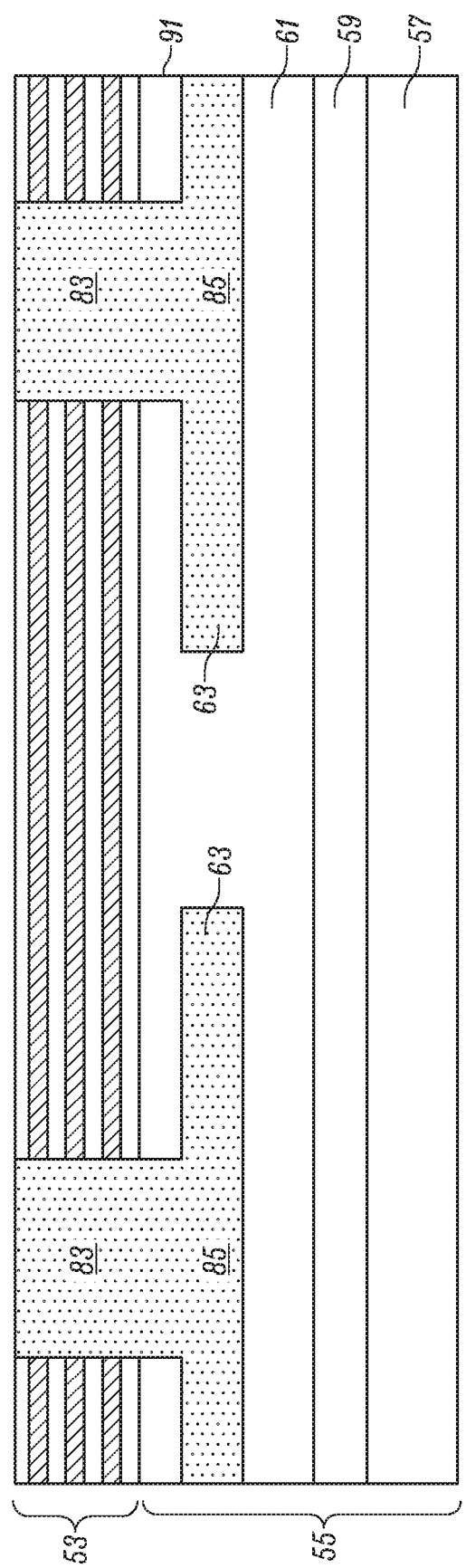
FIG. 12 illustrates a cross-sectional view of the structure of FIG. 11 after formation of the high voltage protection contact openings and after the stripping of the mask.

FIG. 11 illustrates a formation of another protective mask 64 on the upper surface of the device being fabricated with portions of the mask 64 selectively removed to form openings 92. The protective mask 64 can be formed of a photoresist material or formed as a hard mask. FIG. 11 also illustrates the structure undergoing a p+ dopant implantation process 220 to implant p+ doped material into the heterostructure to form p+ doped surface contact portion 83 (FIG. 12) that are in electrical contact with the p-doped buried region 85. The resulting structure is illustrated in FIG. 12 after the mask 64 has been removed. The p-doped buried region 85 and the p-doped surface contact portion 83 form high voltage protection region 63 that grow to pinch off the transistor in response to a high voltage across the drain and sources of the device in an "OFF" state.

Figure 13:
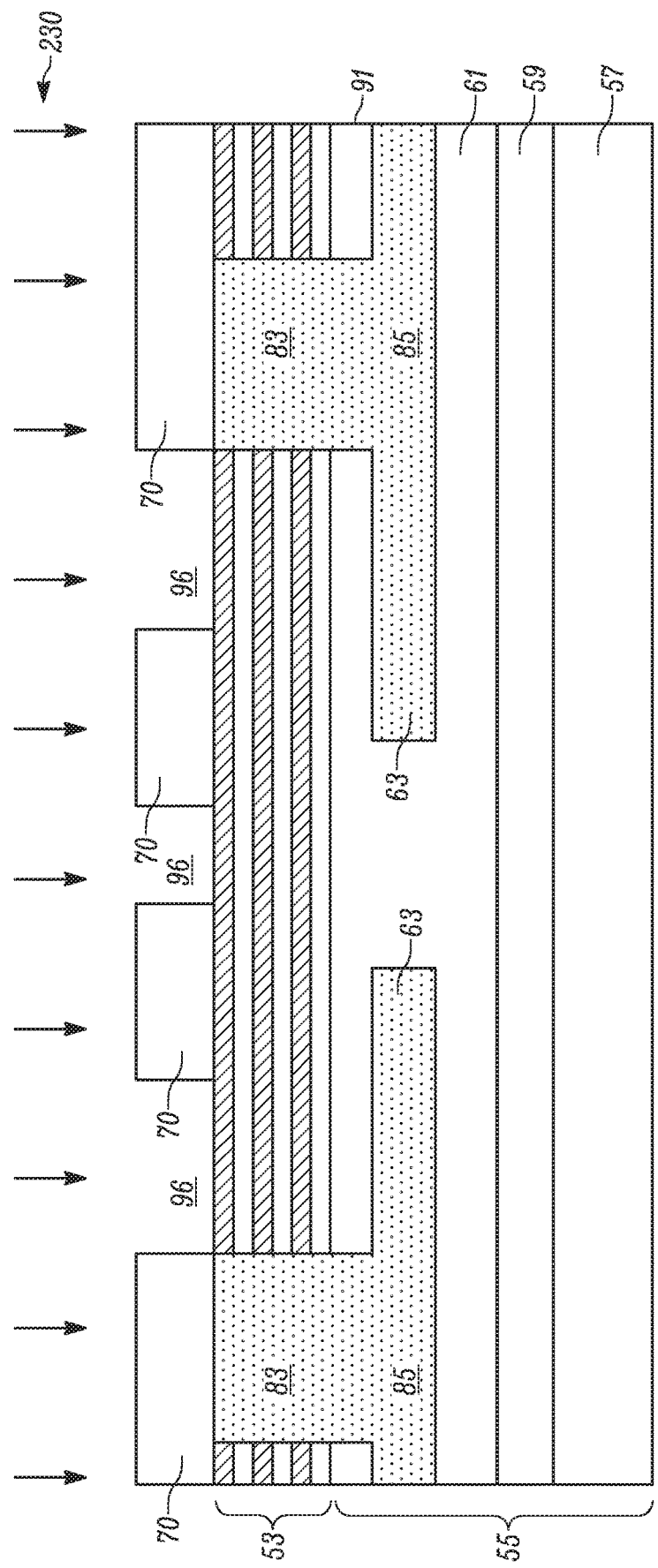
FIG. 13 illustrates a cross-sectional view of the structure of FIG. 12 with a mask in place to define the source and floating drain.

FIG. 13 illustrates formation of an etch mask 70 with patterned openings 96 over the structure of FIG. 12. This etch mask 70 specifies (unblocks) areas where openings 98 (FIG. 14) are to be formed. The etch mask 70 can also be used to form a plurality of multichannel ridges from the superlattice heterostructure 53. That is, the multichannel ridges can be formed at this time/stage, or just prior or just after this stage. Techniques for forming alternating multichannel ridges and non-channel openings are disclosed in commonly owned U.S. Pat. No. 9,419,120, entitled, "Multichannel Devices with Improved Performances and Methods of Making the Same", and commonly owned U.S. Pat. No. 9,773,897, entitled, "Multichannel Devices with Gate Structures to Increase Breakdown Voltage", both of which are herein incorporated by reference.

Figure 14:
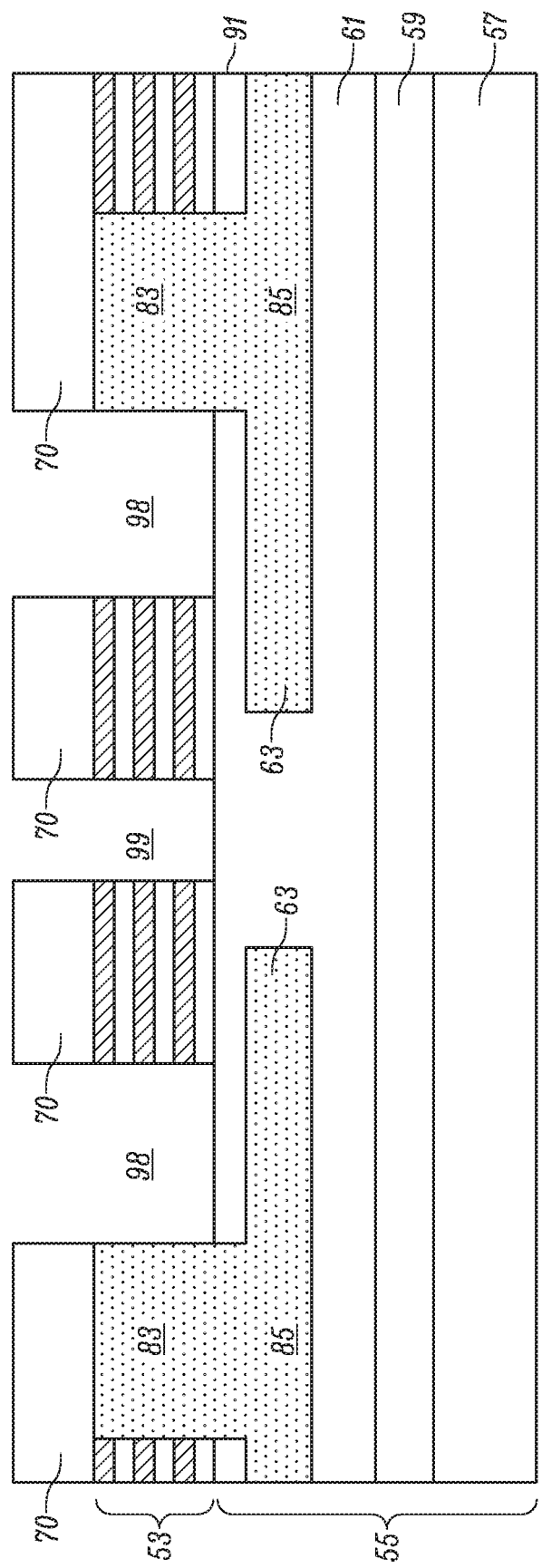
FIG. 14 illustrates a cross-sectional view of the structure of FIG. 13 after undergoing the etching process to form source and floating drain openings.
Figure 15:
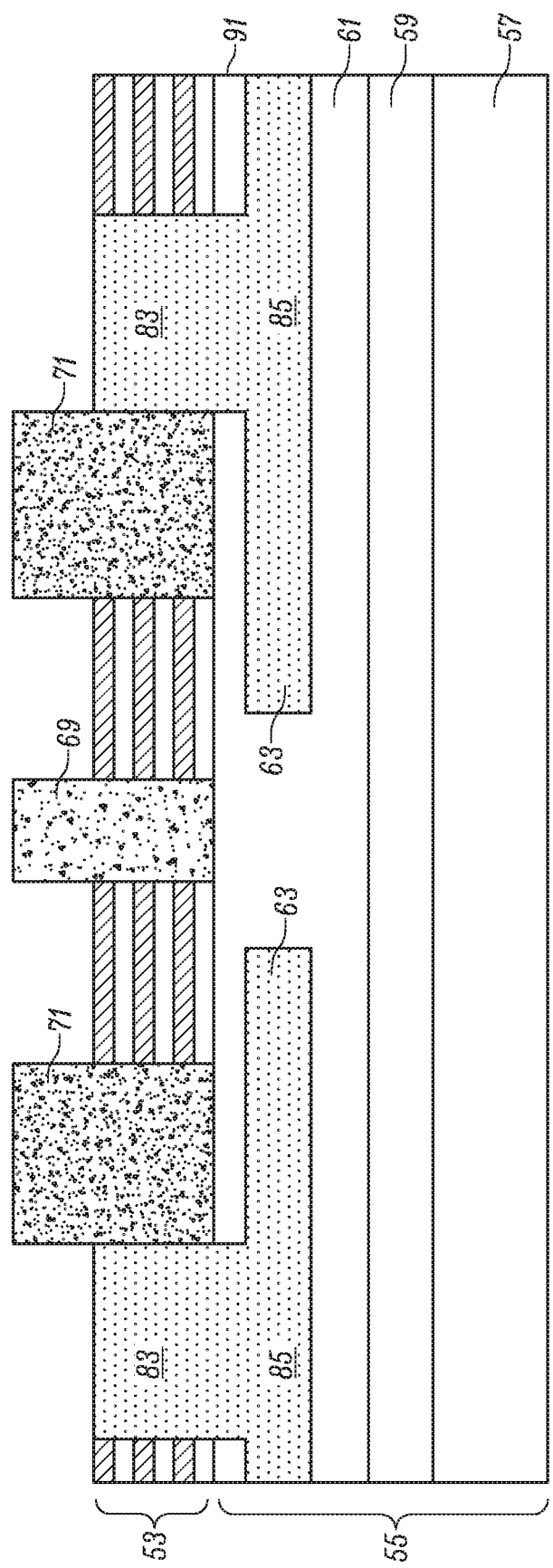
FIG. 15 illustrates a cross-sectional view of the structure of FIG. 14 after undergoing a source contact and floating drain deposition process.

Additionally, FIG. 13 illustrates the structure undergoing an etch process 230 to form the opening 98 and an opening 99 for depositing or regrowing n+ doped material in the openings to form a source interface region 71 and a floating drain 69, respectively. The resultant structure is illustrated in FIG. 14 after the etch process 230 has been completed. Next, the structure undergoes a deposition or regrowth process to fill the openings with the n+ doped material to form source interface region 71 and floating drain 69 (FIG. 15). The regrowth occurs at this stage until the n+ regrowth has reached a height to the top of the etch mask. FIG. 15 illustrates the resultant structure after the n+ regrowth has been completed and the etch mask 70 has having been removed.

Figure 16:
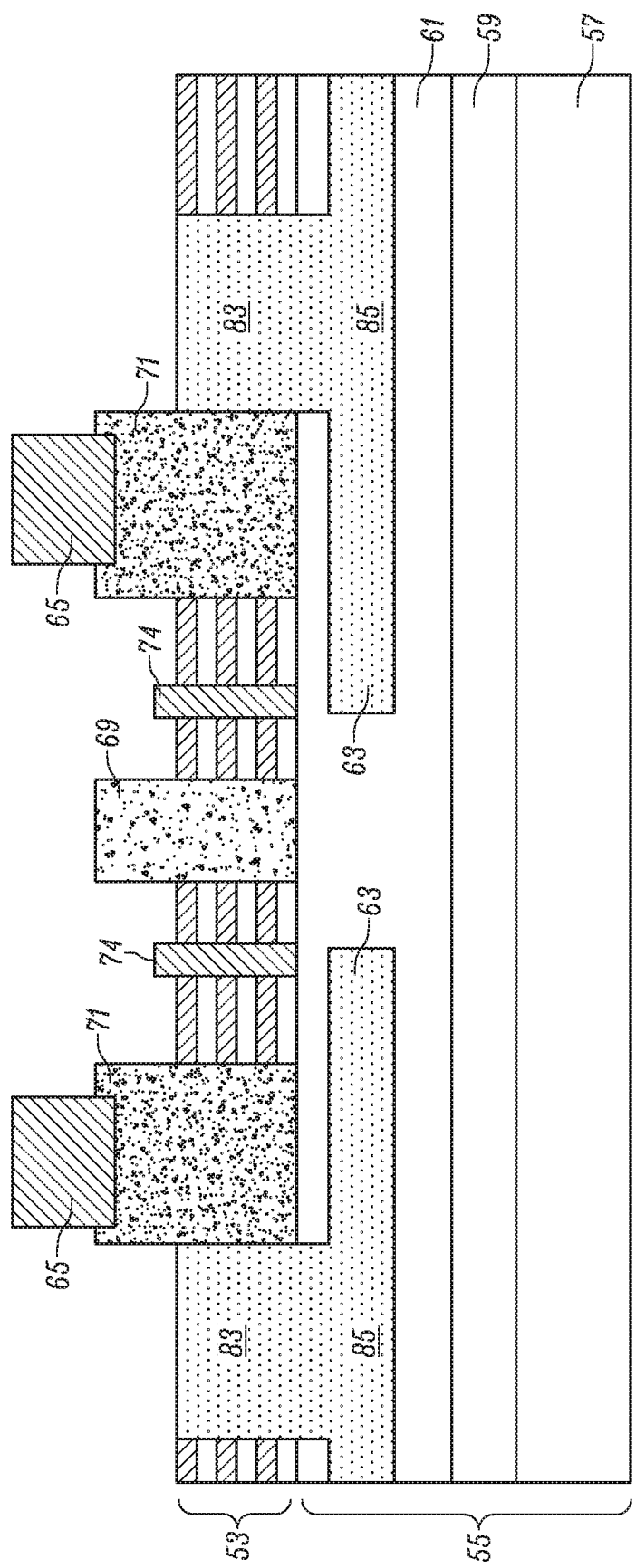
FIG. 16 illustrates a cross-sectional view of the structure of FIG. 15 after metallization of a source contact and a castellated gate contact.
Figure 17:
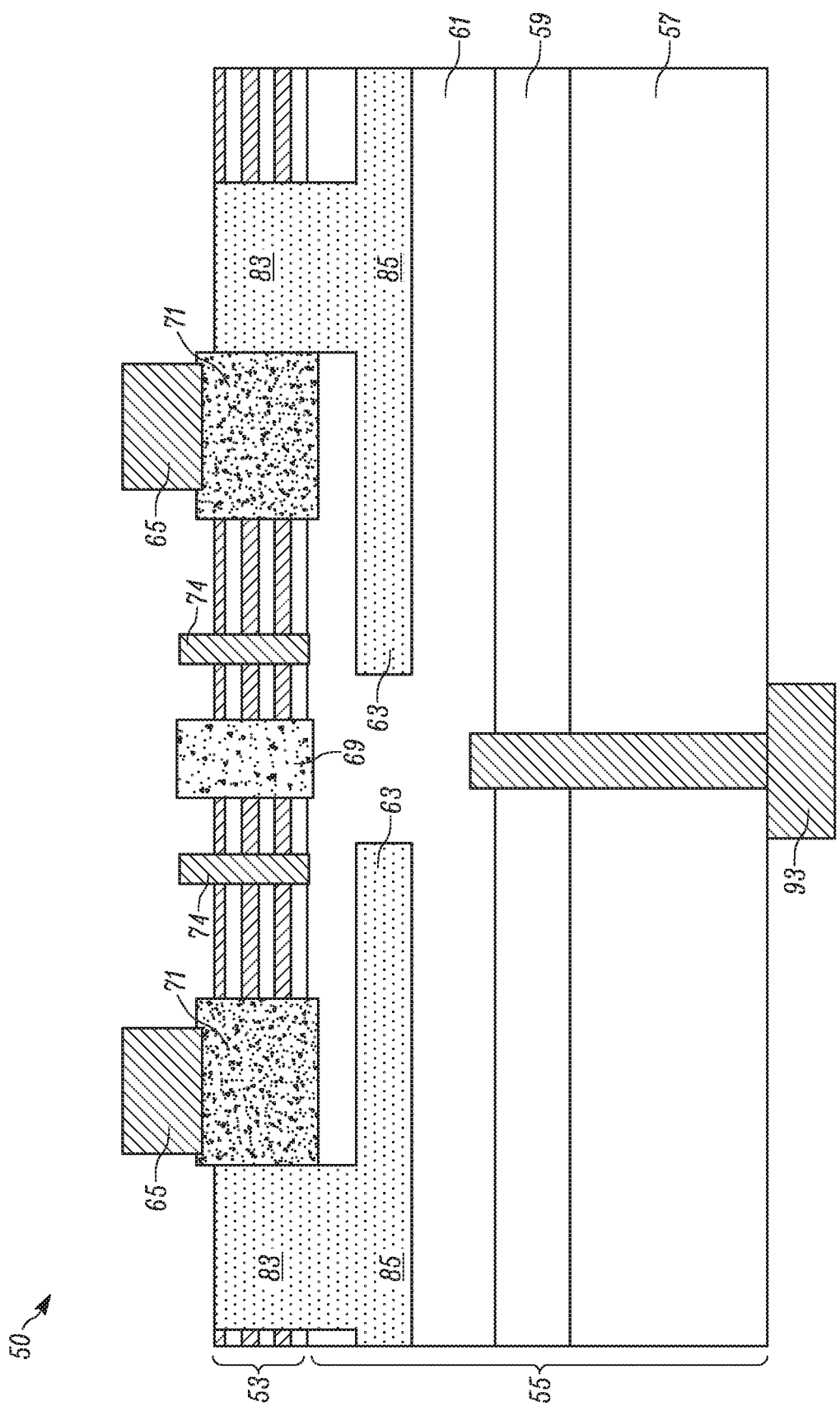
FIG. 17 illustrates a cross-sectional view of the structure of FIG. 16 after formation of a backside drain contact.

Example FIG. 16 illustrates the structure of FIG. 15 after a source contact 65 has been formed onto the upper surface of the source n+ regrowth region 71, so that source input connections can now be formed, and a castellated gate contact 74 through the multichannel ridges and non-channel openings. These metal components may be ohmic types of metal for creating input contacts for the source inputs. Next, the structure is flipped so that the base bottom is pointing upward. This orientation allows drain material to be deposited by etching the bottom of the base structure 55 to form an opening and performing a series of deposition processes to form a drain plug 93 as illustrated in FIG. 17. After the creation of the drain plug 93, a vSLCFET device 50 (FIG. 17) has the necessary major components and may be considered a generally completed SLCFET high-voltage power-transistor device.

Figure 18:
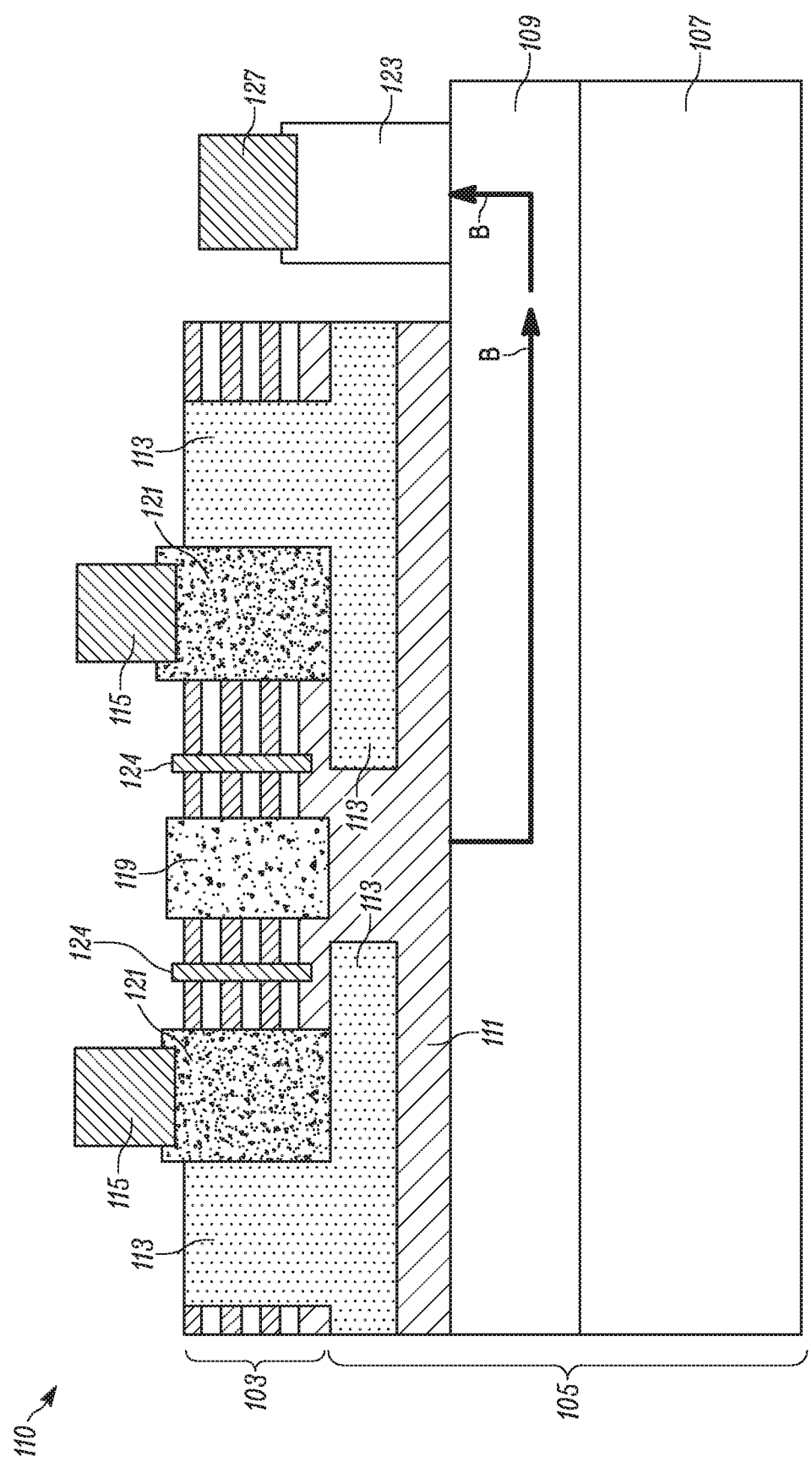
FIG. 18 illustrates a cross-sectional view of another example SLCFET with its drain contact horizontally disposed from the source contacts so that all connections are located on a top side of the vSLCFET.

FIG. 18 illustrates another example of a vSLCFET device 110 that has its source interface region 121 and source contact 115, floating drain 119, and castellated gate contact 124 all on the upper surface of the vSLCFET device 110. Similar to the vSLCFET device 10 of FIG. 1, the vSLCFET device 110 of FIG. 18 includes a base 105 and a superlattice 103. In this example illustration, the base 105 includes an n+ SiC region 107, an n− SiC drift region 109 overlying the n+ SiC region 107, and an undoped GaN drift region 111 overlying the n− SiC drift region 109. Of course, other appropriate materials may be used for these or other components of the example vSLCFET device 110 of FIG. 18.

The example vSLCFET device 110 of FIG. 18 may include other components with similar compositions, geometries, and functionality to the vSLCFET device 10 of FIG. 1. The vSLCFET device 110 of FIG. 18 includes a high voltage protection region 113 to protect against high voltage off states. The primary difference between the example vSLCFET device 10 of FIG. 1 and example vSLCFET device 110 of FIG. 18 is that the drain 123 and its drain contact 127 are located off to the side of a source contact 115 away from the floating drain 119.

The operation of the example vSLCFET device 110 of FIG. 18 is initially similar to that the example vSLCFET device 10 of FIG. 1. As shown by arrows B in FIG. 18, current flows from the source contact 115 through the superlattice 103, through gate 124, when the gates are turned off, and then into the floating drain 119 (floating drain plunger). The floating drain 119 provides a pathway for the current to flow from the upper levels of the superlattice 103 downwards towards the base 105. The current will then flow downwards from the floating drain 119 and through the doped drift region 109 (arrows B) and up to the drain 123 where it exits the vSLCFET device 110 through the drain contact 127.

Figure 19:
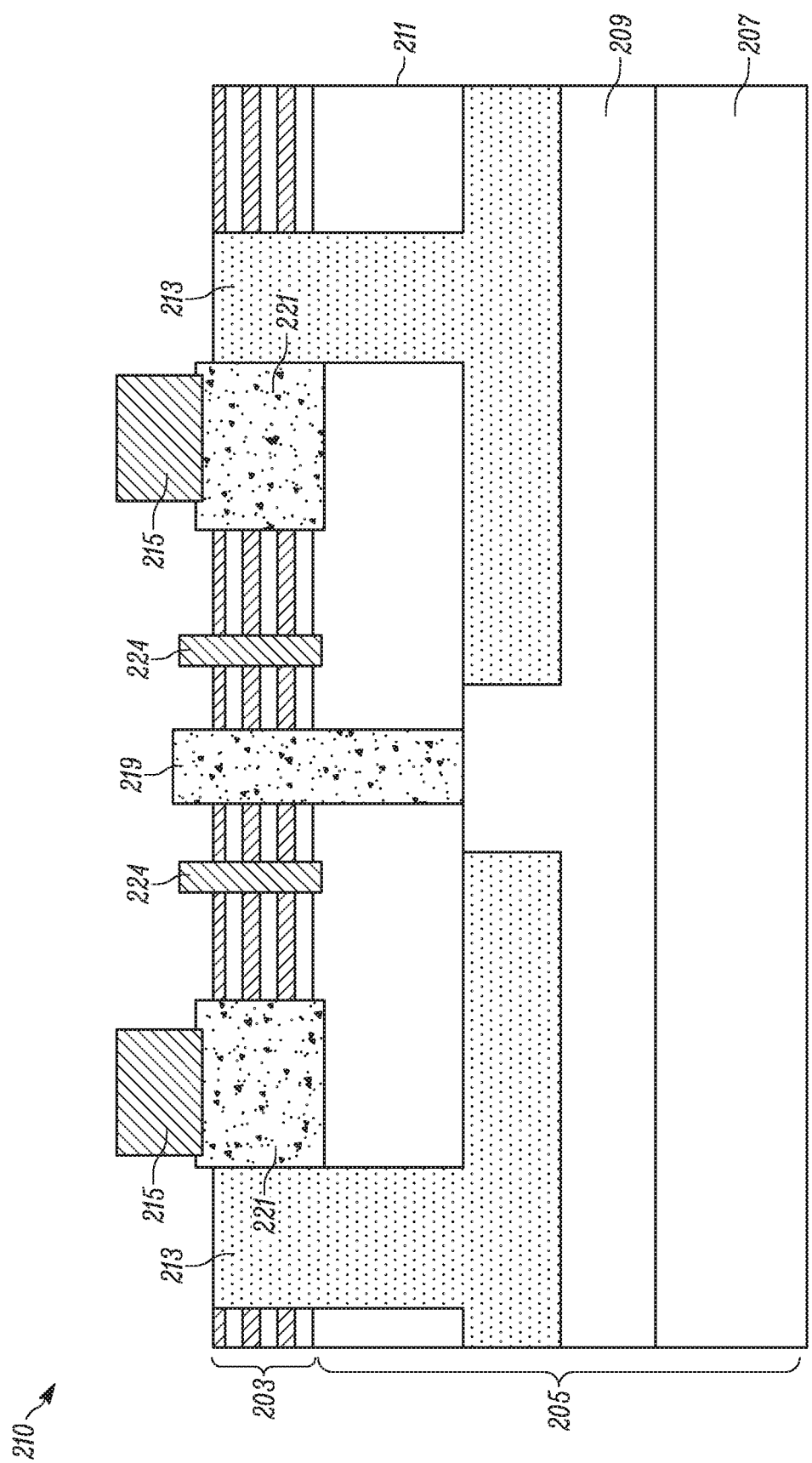
FIG. 19 illustrates an example cross-sectional view of another example vSLCFET in which the buried blocking layer formed in the SiC substrate material rather than the epitaxial GaN. The floating drain is extended downward to reach the underlying SiC substrate as well.

FIG. 19 illustrates another example of a vSLCFET device 210 that has source interface region 221 and source contact 215, floating drain 219, and castellated gate 224 on the same, upper, surface of the vSLCFET device 210. The vSLCFET device 210 of FIG. 19 includes a base 205 and a superlattice 203. In this example illustration, the base 205 includes an n+ SiC region 207, an n– SiC drift region 209 overlying the n+ SiC region 207, and an undoped GaN drift region 211 overlying the n-SiC drift region 209. Of course, other appropriate materials may be used for these or other components of the example vSLCFET device 210 of FIG. 19.

The example vSLCFET device 210 of FIG. 19 may include other components with similar compositions, geometries, and functionality to the vSLCFET device 10 of FIG. 1. The vSLCFET device 210 of FIG. 19 includes a high voltage protection region 213 with a buried dopant region that resides in the n– SiC drift region 209. The primary difference between the example vSLCFET device 210 of FIG. 19 and example vSLCFET device 10 of FIG. 1 is that it contains a floating drain 219 that extends from a top surface of the vSLCFET device 210 through the undoped GaN drift region 211 to the n– SiC drift region 209.

The operation of the example vSLCFET device 210 of FIG. 19 is initially similar to that the example vSLCFET device 10 of FIG. 1. Current will flow (electrons or holes depending on a specific configuration) in response to an applied voltage drop across the source contact 215 and the castellated gate 224. Similar to the example vSLCFET device 10 of FIG. 1, current flows from the source contact 215 and source interface region 221 through the superlattice 203, through the castellated gate 224, when the castellated gate is turned off, and then into the floating drain 219 (floating drain plunger). The floating drain 219 provides a pathway for the current to flow from the upper levels of the superlattice 203 downwards towards the n– SiC drift region 209 and n+ SiC region 207 to a drain (not shown) on the bottom of the vSLCFET device 210.

The examples of the invention described above are a merely a few representative examples of the invention. It is, of course, not possible to describe every conceivable combination of components or methodologies for purposes of describing the invention, but one of ordinary skill in the art will recognize that many further combinations and permutations of the invention are possible. Accordingly, the invention embraces all such alterations, modifications, and variations that fall within the scope of this application, including the appended claims.

What is claimed is:

1. A vertical transistor comprising:
a base structure;
a superlattice structure overlying the base structure and comprising a multichannel ridge having a top and sidewalls, the multichannel ridge having a depth, and the multichannel ridge comprising a plurality of heterostructures that each form a channel of the multichannel ridge;
a source region that overlies the base structure and is in contact with a first end of the superlattice structure;
a floating drain that overlies the base structure and is in contact with a second end of the superlattice structure; and
a drain,
wherein the vertical transistor is configured such that when the vertical transistor is in an 'ON' state, current is capable of flowing from the source region through the channels of the multichannel ridge to the floating drain, which is capable of funneling the current to the drain through at least a portion of the base structure.

2. The vertical transistor of claim 1, wherein each heterostructure is formed from an AlGaN layer and a GaN layer, wherein the AlGaN layer is a layer that is doped.

3. The vertical transistor of claim 1, further comprising a gate contact that wraps around and substantially surrounds the top and at least one side of the multichannel ridge.

4. The vertical transistor of claim 1, further comprising a plurality of multichannel ridges spaced apart from one another by non-channel openings and each comprising a plurality of heterostructures that each form a portion of a parallel channel of each respective multichannel ridge of the plurality of multichannel ridges.

5. The vertical transistor of claim 4, further comprising a gate contact that wraps around and substantially surrounds the top and both sides of each of the plurality of multichannel ridges along their depth.

6. The vertical transistor of claim 1, wherein the vertical transistor has a general circular shape.

7. The vertical transistor of claim 1, wherein the drain is disposed on a bottom surface of the base structure and extends into a portion of the base structure in general alignment with the floating drain.

8. The vertical transistor of claim 1, wherein the drain is disposed on a top surface of the base structure wherein current is capable of flowing from the floating drain to the base structure along a portion of the base structure and back up to the drain.

9. The vertical transistor of claim 1, further comprising a high voltage protection region that is configured to act as a depletion region that is capable of growing to pinch off the vertical transistor in response to high voltages on the source region when the vertical transistor is in an 'OFF' state.

10. A transistor comprising:
a base structure;
a generally circular source region that overlies the base structure;
a floating drain that overlies the base structure and resides within the generally circular source region;
a superlattice structure overlying the base structure positioned in between the generally circular source region and the floating drain, and comprising a plurality of multichannel ridges spaced apart from one another by non-channel openings, each of the plurality of multichannel ridges having a top and sidewalls, each of the plurality of multichannel ridges having a depth, and each of the plurality of multichannel ridges being formed from a plurality of heterostructures that each form a channel of the plurality of multichannel ridges, the plurality of multichannel ridges and non-channel openings each having a generally radial direction from the floating drain to the generally circular source region; and a drain, wherein the vertical transistor is configured such that when the vertical transistor is in an 'ON' state, current is capable of flowing from the generally circular source region through the channels of the multichannel ridges to the floating drain, which is capable of funneling the current to the drain through at least a portion of the base structure.

11. The transistor of claim 10, wherein the floating drain extends through a portion of the base structure.

12. The transistor of claim 10, further comprising a gate contact disposed between the source region and the floating drain, wherein the gate contact wraps around and substantially surrounds the top and both sides of each of the multichannel ridges along their depth, and wherein a voltage applied above a threshold to the gate contacts is capable of turning the vertical transistor to an 'OFF' state.

13. The transistor of claim 10, wherein the drain is disposed on a bottom surface of the base structure and extends into a portion of the base structure in general alignment with the floating drain.

14. The transistor of claim 10, wherein the drain is disposed on a top surface of the base structure wherein current is capable of flowing from the floating drain to the base structure along a portion of the base structure and back up to the drain.

15. The transistor of claim 10, further comprising a high voltage protection region in contact with the source region, the high voltage protection region being configured to act as a depletion region that is capable of growing to pinch off the vertical transistor in response to a high voltage on the source region when the vertical transistor is in an 'OFF' state.

16. A method of forming a vertical transistor, the method comprising:
    forming a superlattice structure having a plurality of heterostructures over a base structure;
    etching openings in the superlattice structure to form a plurality of multichannel ridges spaced apart from one another by non-channel openings, each of the plurality of multichannel ridges being formed from a plurality of heterostructures, each of the multichannel ridges having a top and sidewalls, and each of the multichannel ridges having a depth;
    etching a source region opening and a floating drain opening in the superlattice structure;
    filling the source region opening and the floating drain opening with a doped material to form a source region and a floating drain; and
    forming a drain in the base structure.

17. The method of claim 16, further comprising forming a gate contact that wraps around and substantially surrounds the top and at least one side of each of the multichannel ridges along at least a portion of their depth.

18. The method of claim 16, wherein the drain is formed on a bottom surface of the base structure and extends into a portion of the base structure in general alignment with the floating drain, or the drain is formed on a top surface of the base structure.

19. The method of claim 16, further comprising forming a high voltage protection region in contact with the source region, the high voltage protection region being configured to act as a depletion region that is capable of growing to pinch off the vertical transistor in response to a high voltage on the source region when the vertical transistor is in an 'OFF' state.

20. The method of claim 16, wherein the vertical transistor has a general circular shape.

* * * * *